United States Patent [19]

Mahoney

[11] Patent Number: 6,033,484
[45] Date of Patent: Mar. 7, 2000

[54] METHOD AND APPARATUS FOR CLEANING CONTAMINATED SURFACES USING ENERGETIC CLUSTER BEAMS

[75] Inventor: John F. Mahoney, South Pasadena, Calif.

[73] Assignee: Phrasor Scientific, Inc., Duarte, Calif.

[21] Appl. No.: 09/099,511

[22] Filed: Jun. 18, 1998

Related U.S. Application Data

[62] Division of application No. 08/550,302, Oct. 30, 1995, Pat. No. 5,796,111.

[51] Int. Cl.[7] .................................................... B08B 6/00
[52] U.S. Cl. ............................... 134/1; 134/1.3; 216/66; 216/94; 250/251
[58] Field of Search .................................. 134/1, 1.3, 21; 216/66, 83, 92, 94; 250/251, 492.2, 423 R

[56] References Cited

U.S. PATENT DOCUMENTS

| | | | |
|---|---|---|---|
| 4,737,637 | 4/1988 | Knauer | 250/281 |
| 5,019,712 | 5/1991 | Knauer | 250/423 R |
| 5,290,732 | 3/1994 | Kumar et al. | 216/13 |
| 5,331,172 | 7/1994 | Kumar et al. | 250/492.21 |
| 5,811,020 | 9/1998 | Alwan | 216/42 |

*Primary Examiner*—Randy Gulakowski
*Assistant Examiner*—Saeed Chaudhry
*Attorney, Agent, or Firm*—Blakely, Sokoloff, Taylor & Zafman LLP

[57] ABSTRACT

A method for cleaning contaminated surfaces, especially semiconductor wafers, using energetic cluster beams is disclosed. In this system, charged beams consisting of microdroplets or clusters having a prescribed composition, velocity, energy and size are directed onto a target substrate dislodging contaminant material. The charged, high energy cluster beams are formed by electrostatically atomizing a conductive fluid fed pneumatically to the tip of one or more capillary-like emitters. The high extraction field necessary for atomization and formation of charged clusters, on the order $10^5$ volts/cm or greater, is provided by applying a potential difference between the emitters and a counterelectrode. Since the charged clusters, typically 0.01 to 0.1 micron in diameter, are multiply charged, acceleration through 10 kV or more results in large substrate impact energies greater than 0.5 million electronvolts. Because beam clusters are massive compared to ion beams, they expend their energy over an extended area of the target causing the simultaneous liftoff and removal of micron and submicron particulates, organic films and metallic contaminants. Although individual cluster impact energies are high, the energy is shared by the large number of cluster nucleons. This results in specific energies at impact less than 1 eV/nucleon, well below material sputtering thresholds, preventing direct etching or damage to impacted surfaces during the contaminant removal process. To prevent substrate charging, neutralization can be accomplished by injecting electrons into focused or nonfocused cluster beams.

6 Claims, 4 Drawing Sheets

Fluid From Reservoir

METHOD AND APPARATUS FOR CLEANING CONTAMINATED SURFACES USING ENERGETIC CLUSTER BEAMS

This is a divisional of U.S. application Ser. No. 08/550,302, filed Oct. 30 1995, noe U.S. Pat. No. 5,796,111.

BACKGROUND OF THE INVENTION

1. Field of the Invention

The present invention relates in general to a method and apparatus for cleaning surfaces, and in particular to the removal of organic films, particulate matter and other contaminants from the surface of semiconductor wafers.

2. Description of the Prior Art

The removal of contaminants from surfaces is critical for the profitable manufacturing and subsequent performance of many devices and processes. For example, device yields in semiconductor fabrication facilities are adversely affected by defects caused by particulates adhering to wafer surfaces. More than 80% of the yield loss of volume-manufactured VLSI's is attributed to particulate microcontamination. As device geometries continue to shrink and wafer sizes increase, particle contamination will have an ever increasing impact on device yields. New technologies will be required to clean wafer surfaces to meet national goals for producing 0.07 micron feature sizes by the year 2010. It is now recognized that the future need in semiconductor wafer processing requires removal of particulates 0.1 micron in size and smaller which are highly resistant to removal by conventional cleaning technologies. Present particle removal technologies become increasingly ineffective as "killer" particle size decrease.

Particles generated within process tool equipment, especially in the backend of a multilevel process, represent a major source of yield loss in terms of defective chips. At the present time, there is no commercially available, in-situ cleaning instrumentation for processing wafers in vacuum. The requirements placed on surface cleanliness for microelectronics device fabrication also apply to the manufacturing of micromachines and microsensors based on silicon or gallium arsenide wafer preparation technology.

In addition to cleaning semiconductor wafers and processing tools, the present invention also relates to the cleaning of ground or spacecraft optics such as mirrors, lenses and windows. Other areas of application of the invention include the cleaning of silicon or other substrate materials to lower costs and uphold reliability during the manufacturing of flat panel displays; cleaning spacecraft thermal control surfaces and solar panels; cleaning surfaces in preparedness for deposition of thick or thin film materials to improve adhesion or growth dynamics; precision cleaning and removal of contaminants from vacuum chamber walls and internal mechanical/optical systems in major facilities such as the National Ignition Facility for fusion research and surfaces critical for the control of pharmacological cross-contamination.

Additional areas of application for the present invention include the cleaning of critical surfaces relevant to computers such as magnetic disk storage media. The continued evolution of computer technology has resulted in increasing demands for chemically clean and particulate-free surfaces. As computer technology continues to rely on microelectronics devices that shrink in size, product yield has become increasingly vulnerable to chemical and particulate contaminants.

Thin film structures are used in a variety of industrial applications including optical components, industrial platings, solar cells, wear and corrosion resistant coatings and coatings for transmissive and reflective elements to name a few. Thin films structures are adversely affected by the presence of chemical and micron-sized contaminants which impede the growth, adhesion, wear resistance and stability of the films. The present invention provides an enhanced cleaning process for a variety of solid surfaces compared to conventional cleaning techniques used in the above applications. For a review of cleaning techniques for removing particulates from surfaces, see J. Bardina, "Methods For Surface Particle Removal: A Comparative Study", Particulate Sci.Technol., 6, 121, 1988.

At present there are two principal methods of cleaning wafer surfaces: liquid phase or "wet" cleaning and gas phase or "dry" cleaning designed to remove process chemicals, films and particulate contamination. These methodologies suffer from several drawbacks, the most serious being that no single technology rids surfaces of organic films, trace metallic elements or particulates simultaneously. In some cases, the cleaning process is a source of contaminants itself. Even megasonic techniques, which can remove particulates in a give size range may not be effective for removing particulates <0.1 micron. Furthermore, ultrasonic cleaning efficiencies show some dependency on particulate composition and morphology. Wet cleaning technologies also suffer by consuming large quantities of water. The need to conserve water and reduce costs associated with water usage are obvious. Additionally, wet cleaning technologies consume large quantities of environmentally hazardous chemicals such as inorganic acids, bases and etches including sulfuric acid, phosphoric acid, hydrofluoric and hydrochloric acids; ammonium fluoride; ammonium, sodium and potassium hydroxides and hydrogen peroxide to mention a few. These materials create proper handling and waste storage problems. The current status of wet chemistry cleaning technologies is discussed by Hattori, "Trends in Wafer Cleaning Technology", Solid State Technol. Suppl., p.S7, May, 1995.

The use of dry ice snow flakes, formed by the expansion of liquid $CO_2$ jet sprays, have also been used to clean spacecraft optical surfaces and semiconductor devices. These applications are discussed in M. M. Hills, "Carbon Dioxide Jet Spray Cleaning of Molecular Contaminants", J.Vac.Sci.Technol. A13(1), 30, January/February 1995 and R. Sherman et al., "Dry Surface Cleaning Using $CO_2$ Snow", J.Vac.Sci.Technol.,B9(4),1970, July/August 1991. Although capable of removing organic films and particulates, $CO_2$ jet sprays are ineffectual for removing submicron particulates (<0.1 micron) to levels specified for future microcontamination-free manufacturing of wafers.

Other "dry" cleaning technologies for removing contaminants from semiconductor wafers include gas-phase cleaning which uses reactive gaseous radicals formed by the excitation of process gases. These processes suffer from the use of complex chemistries which can result in damaged surfaces or removal of substrate material when attempting to remove particulate contaminants.

In order to provide further background information so that the invention may be completely understood and appreciated in its proper context, reference may be made to a number of prior art patents as follows: U.S. Pat. No. 5,196,034 to Ono at al discloses a method for making fine ice particles from ultrapure water; forming an ice particle jet using gas under high pressure and directing a spray of ice particles against the surface of a semiconductor wafer. Ice particle jets formed in this fashion do not have sufficient velocity or size range necessary to dislodge fine submicron particulates below 0.1 micron. The process also suffers from introduction of contaminants via water, gas and transfer lines.

U.S. Pat. No. 5,148,823 to Bran discloses a cleaning system based on a high frequency megasonic process comprising a piezoelectric transducer and transmitter. A method is described which combines the rinse cycle with the cleaning cycle to reduce contamination by eliminating exposure of wafers to a solvent/air interface between cycles. This patent is representative of a class of disclosures relying upon ultrasound technology for removing particles from wafer surfaces; technologies known to consume large quantities of water and solvents requiring disposal in accordance with strict environmental regulations. Additionally, megasonic processing is an ex-situ, wet cleaning method, non-integratable into in-situ gas-phase or vacuum wafer preparation steps. As removal of "killer" particulates less than 0.1 micron becomes more crucial for higher yields of small devices, megasonic frequencies will have to increase beyond the state-of-the-art. Also megasonic cleaning containers must be tailored so as not to interfere with the cleaning power of the megasonic beam.

U.S. Pat. No. 5,089,441 to Moslehi discloses a method for low-temperature (650–800° C.) in-situ dry cleaning process for removing native oxides grown on semiconductor surfaces exposed to wet chemical treatments or to ambient air during transport between process steps. Oxide removal occurs by exposing wafers at elevated temperatures to a dry-cleaning mixture of Germane ($GeH_4$) and hydrogen gas. This method is similar to other gas phase cleaning processes which use reactive gases or gaseous radicals (with or without plasma assistance). Although cleaning organic residues and thin oxide films are demonstrated, these processes do not efficiently remove submicron particulates or trace metals without etch-pitting or damage to the wafer substrate. Furthermore many such dry cleaning methods use corrosive gases such as HF.

U.S. Pat. No. 4,806,171 to Whitlock et al discloses a method for removing particles from a substrate using a stream consisting of solid and gaseous carbon dioxide. This process removes particles which are highly resistant to removal by dry nitrogen streams blown across substrates. However, the solid/gas mixture of $CO_2$ can not efficiently remove submicron particulates trapped in micron-sized etched trenches, etc. Additionally the process is limited to removal of particulate matter leaving other contaminants such as organic films partially intact Also, similar to U.S. Pat. No. 5,196,034, the velocity of the impacting $CO_2$ solids is well below the threshold for inducing microshocks in the impacted material causing desorption and liftoff of ultrafine particulates, metallic and organic matter.

U.S. Pat. No. 5,232,563 to Warfield discloses an electrolytic bath configuration for removing a combination of contaminant materials from wafer surfaces including material lodged in surface recesses. A semiconductor wafer and inert conductive electrode are immersed in a bath consisting of water, an electrolyte such as HCL or $HNO_3$ and a non-ionic surfactant (sulfonic acid). Passing a current through the cleaning cell using a voltage source generates oxygen bubbles at the wafer electrode surface thereby floating contaminants from the surface. A disadvantage of this configuration is that upon removal from the bath, wafer re-contamination occurs when breaking the liquid/air interface since the electrolytic bath surface has been enriched with previously removed contaminants. In common with other wet chemistry cleaning methods, multiple wafer cleaning will require frequent exchange of bath solutions ultimately consuming large quantities of water and chemicals. This ex-situ cleaning method is also likely to be slow, cumbersome and requires excessive non-automated wafer handling.

U.S. Pat. No. 5,151,135 to Magee et al discloses a method for sweeping short (80 nanoseconds or less), low energy pulses (0.1 to 0.3 $J/cm^2$) of ultraviolet laser radiation (wavelength range 180–435 nm) across a substrate for removing chemical, metallic and particulate contaminants. Generally, laser cleaning techniques suffer from several disadvantages. High energy pulsed lasers risk substrate damage by introducing point defects, surface melting or annealing. Non-uniform or high energy homogenous pulses can actually "bake-on" contaminants due to excessive heat conduction. Low energy pulsed lasers produce photon impulses ineffectual for imparting enough momentum to dislodge particulates less than 0.1 micron strongly bonded to the surfaces by tenacious electrostatic forces. Furthermore, more than one pulse may be required to clean contaminants from surfaces irradiated by low energy laser pulses. Multiple passes will be required to clean heavily contaminated areas increasing the time required to clean surfaces. Introducing additional lasers to effect rapid cleaning only introduces complexity and additional expense for systems which are already costly. As disclosed, the usefulness of a pulsed UV laser as a primary cleaning step is unclear, since cited examples of cleaning started with surfaces previously cleaned by wet chemical means, subsequently describing the laser cleaning step as a "topping off" process.

Whatever the precise merits, features and advantages of the above cited references, none of them achieves the purposes of the present invention. Accordingly, it is desirable to provide an improved method and apparatus for removing thin film and particulate contaminants from semiconductor wafers simultaneously with higher efficiency, especially for particulate matter less than 0.1 micron in size. A principle object of the present invention is to remove contaminants from surfaces independent of their size, composition or morphology. Another object of the present invention is to introduce a technology for wafer cleaning which does not use hazardous chemicals or large quantities of highly purified, de-ionized and expensive water. A further object of the present invention is to provide an in situ method for cleaning wafers and wafer processing tools in vacuum, using a supersonic beam of microdroplets (clusters) distributed in size for removing submicron contaminants trapped in surface recesses, etched trenches or vias.

SUMMARY OF THE INVENTION

The aforementioned objects, as well as other objects, are achieved according to the present invention by providing an apparatus and method for removing surface contaminants by impacting surfaces with beams of microdroplets or clusters having a prescribed composition, velocity, energy and size distribution. Beams of high energy clusters, with diameters less than 1 micron and preferably in the range 0.01 to 0.1 micron, are formed by pneumatically feeding a conductive fluid to the tip of a capillary emitter. By applying an electric field to the tip of a capillary or to the edges of a linear slit, the conductive fluid is electrostatically atomized providing a beam of charged clusters. The high extraction field necessary for atomization, of the order $10^5$ volts/cm or greater, is established by applying a potential difference between the emitter and a counterelectrode or extractor. The charged clusters are electrostatically accelerated by the extraction field to hypervelocities and directed toward a target substrate (e.g., wafer). Substrate charging is prevented by ejecting electrons into the beam which neutralize the charge on the clusters. Since the clusters are multiply charged during their formation stage, acceleration through 10 kV or more results in large impact energies greater than 0.5 million electron volts. Because of their massive size compared to ion beams, clusters expend their energy over an extended area of the target causing simultaneous liftoff and removal of micron and submicron particulates, organic film and metallic contaminants. Dislodged contaminants are collected, for example, using a cryogenic shroud preventing their re-introduction on cleansed surfaces. Although individual cluster impact energies are high, the energy is shared by the large number of cluster nucleons. This results in specific energies at impact less than 1 eV/nucleon, well below material sputtering thresholds, preventing direct etching or damage to impacted surfaces during the contaminant removal process. To increase the area of the target cleansed and decrease the time required to remove contaminant species, a plurality of capillary emitters are configured into two or more linear arrays disposed adjacent and parallel to each other. To prevent target substrate charging, charged clusters emitted from single capillary emitters or multiple arrays are neutralized by ejecting electrons into the beam. A novel means for cluster beam neutralization uses two arrays; one array operated with positive high voltage to generate positive clusters and the other operated at negative high voltage to form negative clusters. The array voltages are adjusted independently until the net charge buildup on a target substrate is approximately zero.

BRIEF DESCRIPTION OF THE DRAWINGS

The features, aspects and advantages of the present invention will become more fully apparent from the following detailed description, appended claims and accompanying drawings in which;

DESCRIPTION OF THE PREFERRED EMBODIMENT

Figure 1:
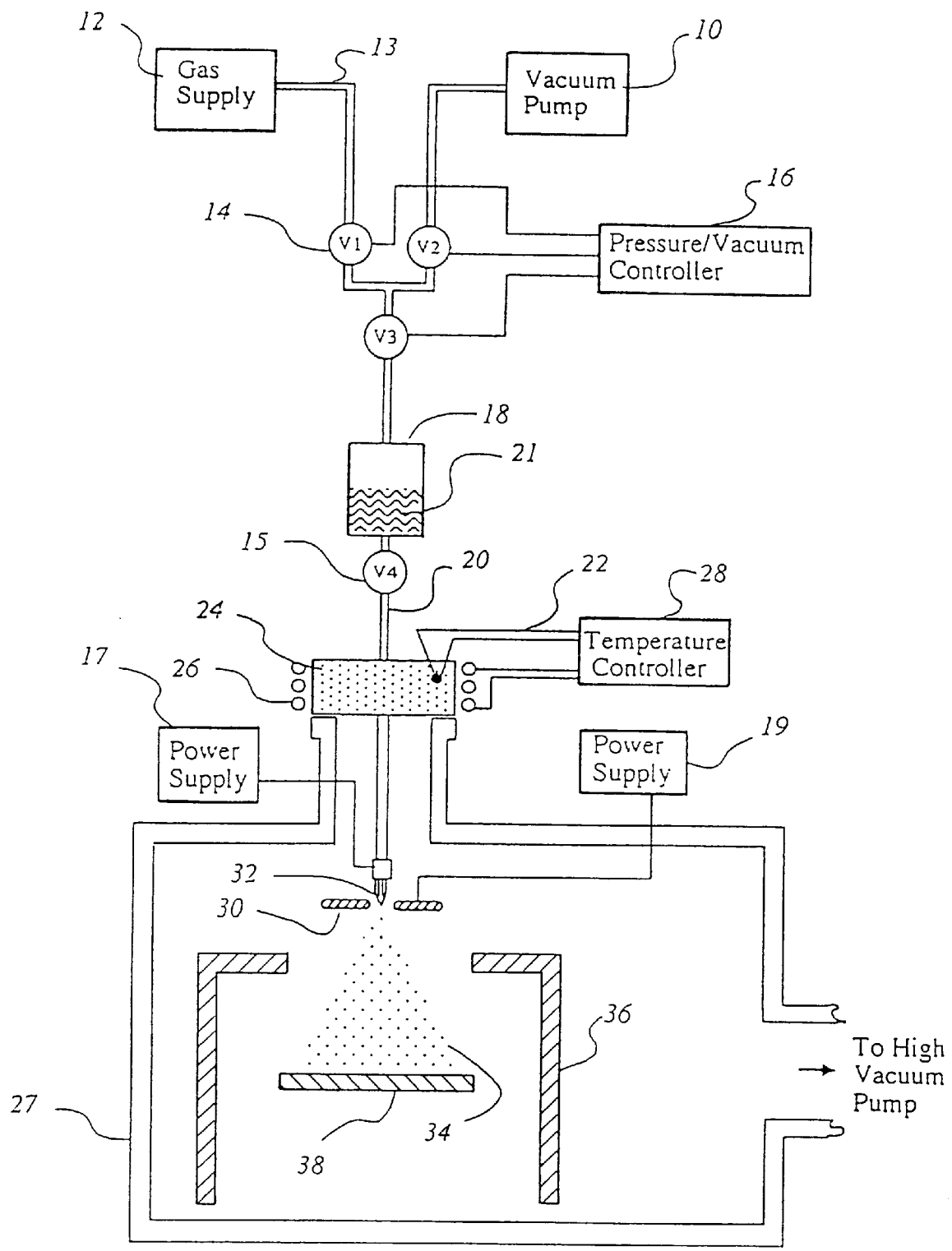
FIG. 1 is a diagram showing the basic concept and apparatus for producing charged clusters used to clean or remove contaminants from surfaces such as semiconductor wafers in accordance with the present invention.
Figure 2:
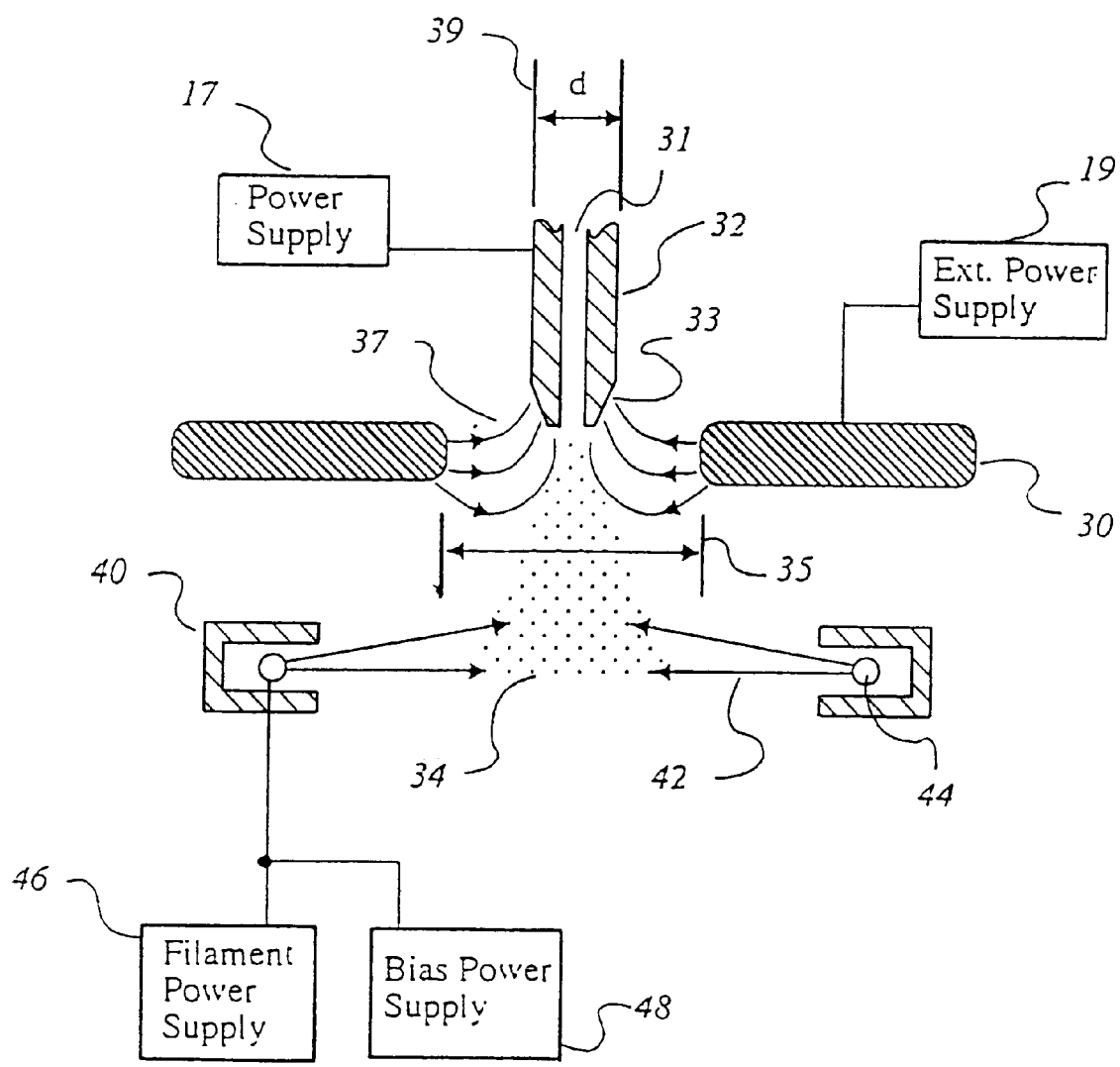
FIG. 2 shows a capillary emitter for generating a charged cluster beam subsequently neutralized by injecting electrons into the beam.

In the following description, numerous details are set forth to provide a thorough understanding of the present invention. However, one having ordinary skill in the art may be able to practice the invention without these specific details. In some instances, well-known features, structures and techniques have not been shown in detail not to unnecessarily obscure the present invention. FIG. 1 and 2 illustrate the preferred embodiment of the invention. The process of the present invention uses a capillary emitter 32 to form a beam 34 of micron or submicron sized clusters or microdroplets. By way of a non-limiting example, the emitter can have the form of a small bore tubular capillary with an inner diameter on the order 0.001 to 0.004 inches. A capillary emitter tip 33 seen in FIG. 2, according to a particularly preferred geometry, can taper at an angle between 20–45°. Although this emitter tip is preferred, satisfactory operation can be obtained with the capillary tip 33 having a blunt end. It is fully contemplated within the scope and spirit of the invention that other capillary tip geometries are possible that will provide beams with desired cluster sizes. The actual dimensions of the capillary bore 31 will depend on the desired flowrate and physical properties of a conductive fluid 21 such as viscosity. In the present embodiment of the invention, the outside diameter 39 of the capillary emitter can be of the order 0.008 to 0.032 inches. Capillary dimensions outside these limits may be suitable. The capillary emitter tube may be formed from many materials including materials which are electrically conductive or insulating. Conductive materials include but are not limited to stainless steel and platinum. Platinum is the preferred material since it exhibits excellent resistance to electrochemical corrosion thereby increasing the lifetime of the capillary emitter tip 33. Electrically insulating materials include but are not limited to glass, ceramics and fused silica.

In a preferred embodiment of the present invention, a conductive fluid 21 from a reservoir 18 flows through a fluid conduit 20 into the capillary emitter 32. A two-way shutoff valve (V4) 15 is inserted in the fluid conduit between the reservoir and capillary emitter as a means of terminating or restarting the flow of fluid to the capillary emitter. Preferred fluid flow rates for a single capillary tube emitter 32 can be of the order 0.1 to 3 microliters/minute-although flow rates outside this range can produce usable cluster beams. Fluid flow rates can be controlled by the geometric flow impedance of the capillary emitter 32; by the pressure above the fluid in the reservoir 18; and by the fluid temperature. The pressure above the solution in the reservoir can be regulated by a pressure/vacuum controller 16 which automatically opens and closes a combination of on-off solenoid valves (V1,V2,V3) 14. With valve (V2) closed, opening valve V(1) connects a regulated gas supply 12 and a gas conduit 13 to the reservoir 18 when valve (V3) is open, exposing the fluid to a positive pressure applied by gas supply 12. When valve (V1) is closed, opening valve (V2) connects a vacuum pump 10 to the reservoir 18 when valve (V3) is open, reducing the pressure over the fluid in reservoir 18. In this manner, reservoir pressures can be adjusted, but not limited to, a preferred range of 50 torr to 30 PSI for controlling flow rates to the capillary emitter. An inert gas such as argon is preferred for pressurizing the reservoir 18 containing the fluid 21. In general it is recommended that the pressurizing gas used resist absorption by the fluid reducing the risk of bubble formation in the fluid conduit 20. Further, outgassing of the fluid 21 to remove dissolved gases is preferred before loading in the reservoir 18.

Flow rates can also be controlled by heating the conductive fluid 21, particularly for fluids whose viscosities show large variations with changes in temperature. An example of a fluid exhibiting this property is one consisting of high concentrations of glycerol. Although various conventional means for heating the solution are available, a satisfactory method is illustrated in FIG. 1. The fluid conduit 20 is vacuum sealed to and passes through a vacuum flange 24. The vacuum flange in turn is mounted and sealed to a high vacuum chamber 27. A heater 26, preferably a flexible, silicone rubber heater encloses and is attached to the flange 24. Heat conducted through the flange 24 warms the fluid conduit 20 in intimate contact with the flange. A thermocouple 22 senses the flange temperature which is regulated by a temperature controller 24. Suitable flange temperatures for controlling the flow rates of glycerol fluids range from ambient to 60° C.

The preferred fluid used for cluster formation in the present invention consists of a high purity glycerol solvent doped with an electrolytic additive such as ammonium acetate. Glycerol is a preferred solvent since it does not introduce any hazardous chemicals or ozone-depleting substances into the wafer cleaning process. Additionally, glycerol possesses a low vapor pressure compatible with high vacuum processing. As a highly polar solvent, glycerol can dissolve a variety of conductive agents such as salts, acids and bases with concentrations that vary over a wide range. When ammonium acetate salt is used to impart conductivity to glycerol, the preferred solution concentrations range from 0.1 N to 2.0 N. Fluids from which clusters are generated, however, are not limited to glycerol. Mixtures of glycerol with water or other miscible solvents can be used as well. More volatile fluids consisting of a dissolved electrolyte in water:methanol, e.g., 60:40 or 50:50 by volume, are also compatible with the cluster generation process. Also, conductive additives are not limited to volatile salts such as quaternium ammonium halides. Non-volatile alkali metal salts such as NaI, CsI and KI can also be introduced into the fluid 21 to provide the conductivities necessary to form clusters or microdroplets in the size range effective for removing contaminants from surfaces. To prevent capillary emitter plugging by salt deposition, volatile additives, as opposed to non-volatile, are preferred in combination with fluids that have high vapor pressure components such as water:methanol mixtures.

With the aid of FIG. 2, the process of generating a beam of clusters or microdroplets will now be described. The conductive fluid from reservoir 18 flows through the fluid conduit 20 and is delivered to the capillary emitter 32 exposed to high vacuum. When the fluid reaches the capillary tip 33, it enters an intense electrostatic field region 37 formed by applying high voltage to the capillary emitter 32. The preferred voltage can be in the range +8 to +20 kV applied by means of a power supply 17. The electric field 37 is established between the capillary tip 33 and an extractor electrode 30 whose potential is adjustable by means of a power supply 19. The relatively intense fields generated at the capillary tip 33 ($>10^5$ volts/cm) result in electrostatic forces stressing the exposed surface of the conductingfluid. As the voltage applied to the capillary emitter 32 is increased, the electrostatic force acting on the fluid surface at the tip 33 also increases until a value is reached that exceeds the surface tension force S holding the fluid together. The fluid disrupts into an aggregate of charged clusters forming a beam 34. If a positive high voltage is applied to the capillary emitter 32 by means of power supply 17, clusters in a beam 34 will be positively charged. Alternatively, if a negative high voltage is applied to the capillary emitter, the beam 34 will consist of negatively charged clusters.

Clusters with smaller or larger mean diameters can be generated by varying the magnitude of the electric field 37. In general, small clusters, having high charge-to-mass ratios, are generated by high electric fields while large clusters, having lower charge-to-mass ratios, are formed at relatively lower electric fields. When a fixed voltage is applied to the capillary emitter 32 by means of power supply 17, the electric field 37 will increase or decrease depending on the voltage applied to the extraction electrode 30 by means of power supply 19. Conversely, by applying a fixed voltage to the extractor electrode 30, the electric field 37 will increase or decrease depending on the voltage applied to the capillary emitter 32. The energy with which clusters impact a target substrate 38 is determined by the voltage applied to the capillary emitter 32, independent of the voltage applied to the extractor electrode 30. In the preferred embodiment of the invention, it is desirous to keep the voltage applied to the capillary emitter constant, corresponding to impact energies greater than 0.5 MeV, and vary the extractor electrode voltage to generate clusters with sizes that efficiently remove contaminants. In summary, the voltage applied to the capillary emitter can be used to control the cluster impact energy and the voltage applied to the extractor electrode can be used to control the mean cluster size.

It should be pointed out that the cluster size distribution in the beam 34 can be modified by other means when the electric field 37 is fixed by the voltages applied to the capillary emitter 32 and the extractor electrode 30. Mean cluster sizes in the distribution can also be shifted to yield smaller or larger mean cluster diameters by varying the flow rate of the conductive fluid, low flow rate s corresponding to smaller clusters and high flow rates corresponding to larger clusters. Finally, for a given fluid flowrate and voltage applied to the capillary emitter 32 and extractor electrode 30, the mean cluster size characterizing the distribution can be modified by varying the conductivity of the fluid 21. For the purpose of removing micron and submicron particulates from wafer surfaces, clusters with mean diameters in the range 0.01 –0.05 micron are preferred. From the foregoing discussion, it is apparent that the system provides sufficient flexibility to adjust the process variables for producing clusters with desired sizes and energies to efficiently remove particulate or organic film contaminants from surfaces.

The cluster beam 34, formed by electrostatically dispersing the fluid at the capillary tip 33, is accelerated by the electric field 37 existing in the gap separating the capillary emitter 32 from the extractor electrode 30. In a preferred embodiment of the invention, a circular opening or extractor aperture 35 in the extractor electrode 30 has a diameter whose dimensions are on the order of ⅛ to ⅜ inch. For symmetry considerations, the extractor aperture 35 is usually circular, if the capillary emitter 32 is tubular, but it is possible to use other shapes. The preferred alignment of the capillary emitter-extractor electrode combination consists of placing the capillary emitter 32 coaxially at the center of the extractor aperture 35 such that the capillary tip 33 lies in the mid-plane of the extractor electrode 30. Although this arrangement is preferred, satisfactory operation can be achieved if the capillary tip 33 is positioned directly behind the rear surface of the extractor electrode 30 to a distance of ⅛ inch. Further retraction of the capillary emitter 32 can cause excessive impingement of the cluster beam 34 on the backside of the extractor electrode 30. Bombardment of the extractor electrode 30 by charged clusters in the beam eject secondary electrons that are accelerated back to the capillary tip 33 causing uncontrolled tip heating when a positive high voltage is applied to the capillary emitter 32.

As seen in FIG. 1, the cluster beam 34 formation and acceleration process is carried out in a vacuum chamber 27. A stationary or transportable target substrate 38 is interposed in the cluster beam 34. In the preferred embodiment of the invention, a non-focused, divergent cluster beam impacts the target substrate 38. In this manner, a large area of the substrate can be cleaned as opposed to a smaller area cleaned by a focused beam. Individual clusters in the beam impact the surface of the target substrate 38 resulting in the effective removal of various types of contaminants. In some instances and for efficacious removal of contaminants, it is desirable to rotate the target substrate 38 with respect to the cluster beam 34 allowing impacts to occur at acute angles of incidence. Contaminants driven from the target substrate 38 deposit on the surfaces of a cryogenic collector 36, cooled by liquid nitrogen or other means preventing their re-deposition on the cleansed substrate surface. An alternate impaction or collection surface may consist of an uncoated, porous, sintered metal mesh or a teflon membrane filter. Particulates removed from surfaces by the impact of cluster beams provide an extremely light loading on collection surfaces. In view of the loading conditions, an oil-coated teflon membrane filter can provide a surface with a collection efficiency of 100% as discussed by C. Tsai, "Solid Particle Collection Characteristics on Impaction Surfaces of Different Designs", Aerosol Sci.Technol., 23, 96,1995. An oil for applying a thin coating to collection surfaces is preferably one having an extremely low vapor pressure ($\approx 10^{-10}$ torr) e.g., a silicone diffusion pump fluid, Model D-7050, manufactured by Dow Corning. Metal or dielectric surfaces charged by application of voltages can suffice for collecting ejected particulate contaminants in some applications.

Several properties of the cluster impacts are important and relevant to the contaminant removal process. Cluster velocities are supersonic and, depending on the acceleration voltage applied to the capillary emitter 32, can exceed the velocity of sound in the impacted material. It is believed that shock waves can be induced in the material impacted (substrate 38, films or particulates) causing shock unloading or liftoff of contaminant species. Because individual clusters can carry a large number of charges (N>100), clusters accelerated through 10 kV or more have impact energies of the order 0.5 to 2.0 MeV's which are deposited over an extended area of the target substrate 38. The direct transfer of a portion of this collisional energy can overcome London - Van de Waal and electrostatic forces bonding contaminants to surfaces. The massiveness of individual clusters in the beam 34, preferably on the order $10^{-16}$ to 10–17 grams, in combination with their supersonic velocities, provide a means for transferring a large momentum to film and particulate contaminants, especially for events involving multiple and energetically additive collisions. A unique feature of the present invention is that, compared to atomic ion or small molecular ion beams, the massiveness of the clusters employed here for cleaning contaminated surfaces insures that the total cluster energy is shared by the large number of nucleons comprising the clusters. Although the total cluster energy may exceed 1 MeV, individual nucleons which participate in collisions have specific energies less than 1 eV/nucleon. On the atomic level, damage or sputtering of the target substrate is prevented. In the preferred embodiment of the invention, this is a critical feature since contaminants must be removed without causing substrate damage or removal of permanent features essential for operating devices constructed from the substrate material. Another unique feature of the present invention is that beam clusters are comparable in size to individual particulate contaminants with diameters less than 1 micron. Submicron clusters are particularly effective for interacting with and removing particulates less than 0.1 micron, a particularly troublesome size if future microelectronics devices are to provide features with sizes approaching 0.07 micron.

If means are not provided for bleeding off excess charge buildup on the target substrate 38, surface charging can occur in the presence of the cluster beam 34. The buildup of potential by surface charging can lead to beam deceleration, reducing the impact energy of the clusters. Further, variations in the potentials between neighboring regions on the target substrate 38 can promote local discharging causing damage to substrate features. In the present embodiment of the invention, a neutralization method is employed to prevent charging of the substrate exposed to a positively charged cluster beam. Referring to FIG. 2, a thermionic emitter 44, preferably made from tantalum or other refractory material which emits copious electrons on being heated, is positioned below the extractor electrode 30. The thermionic emitter 44 is preferably constructed from small diameter wire, in the range 0.010 to 0.020 inches, and bent in a circle symmetrically positioned on the longitudinal axis of the tubular capillary emitter 32. The thermionic emitter 44 can be heated by means of a filament power supply 46 and biased a few volts negative by means of a power supply 48 which provides the energy necessary to launch the electrons along trajectories 42. Electrons escaping the thermionic emitter 44 leave by way of a circular opening placed in the neutralizer shield 40. Neutralization of the cluster beam can be accomplished by trapping electrons within the beam and by the capture of electrons by individual, positively charged clusters. Alternative means for injecting electrons into a beam for neutralization exist with different configurations and materials and need not be discussed here without departing from the scope or spirit of the present invention.

Figure 3:
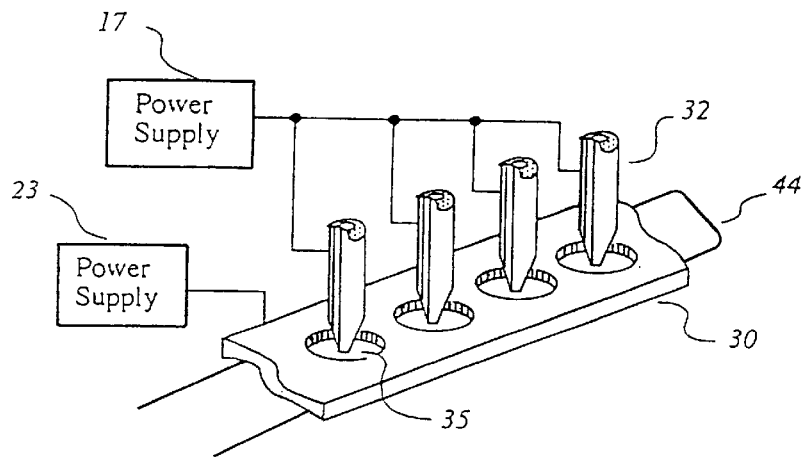
FIG. 3 is a partial perspective view showing a plurality or array of capillary emitters in combination with a thermionic electron emitting filament for beam neutralization.

In order to provide multiple cluster beams for impacting and cleaning larger surface areas and for decreasing the time required to remove contaminants, a second embodiment of the processing apparatus will now be described. FIG. 3 illustrates a linear array consisting of a plurality of capillary emitters 32 for generating multiple, divergent cluster beams. When a plurality of capillary emitters form an array that is linear, hexagonally packed or configured to some other suitable geometry, a single extractor electrode 30 having multiple, circular apertures 35 can be used. The multi-apertured extractor electrode provides the geometry required to establish the intense electric fields at each of the capillary emitters comprising the array. Neutralization of the multiple beams can be provided by a single thermionic emitter 44 described previously for use with a single capillary emitter, configured to conform to the linear dimensions of the array. Positive high voltage in the range +8 to +20 kV, preferably +15 kV in the present embodiment, is applied to each of the capillary emitters by means of a power supply 17. The individual capillary emitters comprising the array can be wired in parallel as shown in FIG. 3.

Figure 5:
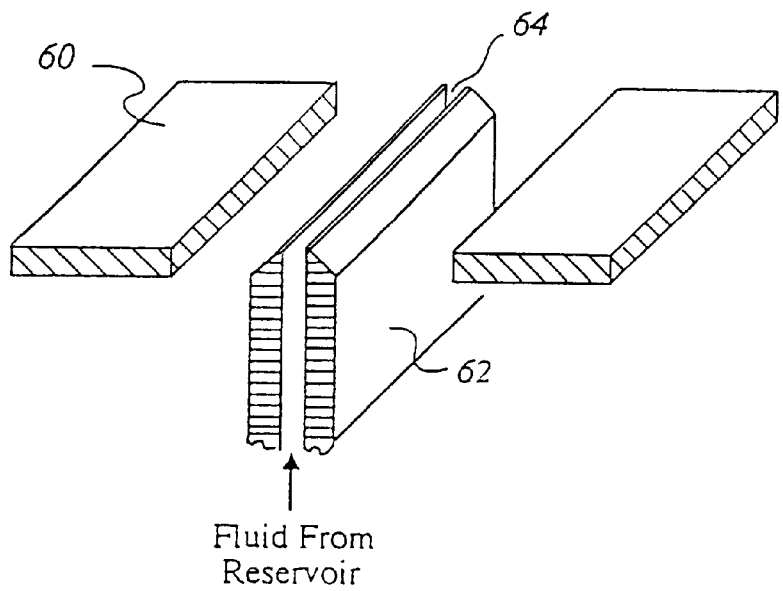
FIG. 5 is a perspective view showing a linear slit capillary emitter geometry for generating a charged cluster beam.

As an alternate to using a plurality of capillary emitters 32, a linear capillary slit 62 as shown in FIG. 5 may be provided. By applying voltage to the capillary slit, a plurality of emissive sites will be formed in the fluid along the slit edges, resulting in the production of plural beams of clusters or microdroplets. The preferred width of the slit channel 64 filled with fluid 21 is of the order 0.001 to 0.004 inches. In FIG. 5 a slotted extractor electrode 60 aids in establishing the intense electric field at the slit edges. Beam neutralization for this configuration (not shown) can be provided by an electron emitting wire filament as seen in FIG. 3.

Figure 4:
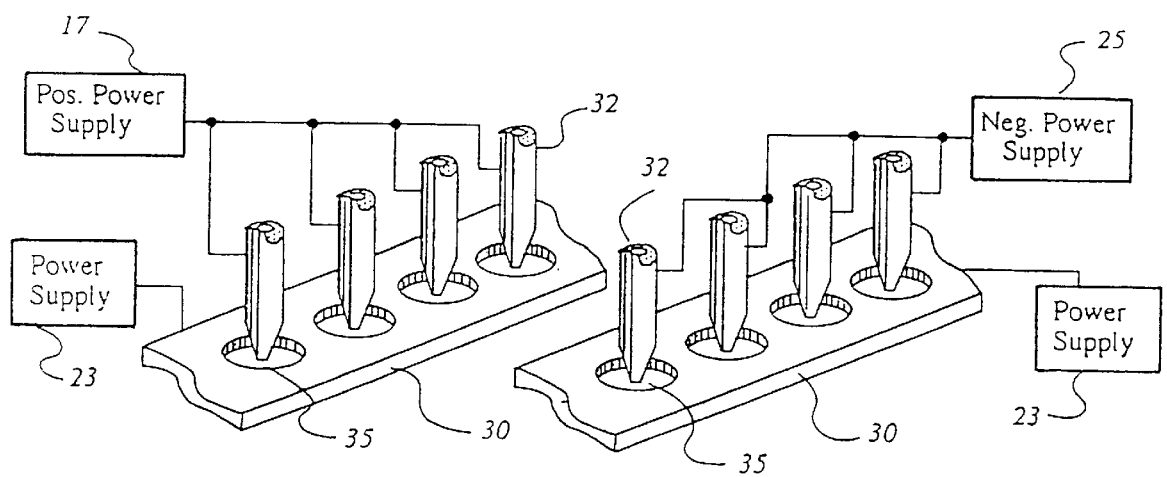
FIG. 4 is a perspective view showing a bipolar arrangement consisting of alternating arrays of positive and negative capillary emitters for beam neutralization.

With the aid of FIG. 4, a novel means for providing beam neutralization is accomplished by employing two or more linear arrays. The left side of FIG. 4 illustrates a linear array consisting of a plurality of capillary emitters 32 wired in parallel to a power supply 17. Positively charged cluster beams will be generated by the array when positive high voltage is applied by means of power supply 17. Similarly, the right side of FIG. 4 illustrates an adjacent linear array consisting of a plurality of capillary emitters 32 wired in parallel to power supply 23. Negatively charged cluster beams will be formed by the array when negative voltage is applied by means of a power supply 23. Using this bipolar arrangement, beams consisting of positively and negatively charged clusters can be generated simultaneously. Beam neutralization can be achieved by adjusting the positive and negative voltages applied by power supplies 17 and 23 until the net charge buildup on the target substrate 38 is approximately zero.

Figure 6:
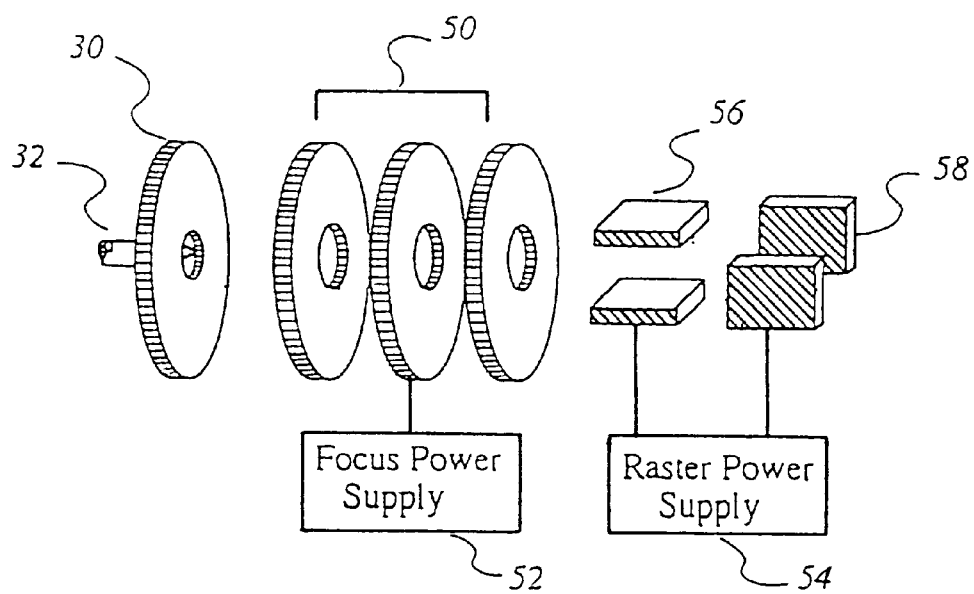
FIG. 6 is a perspective view of a capillary cluster emitter with associated ion optics for focusing and electrostatic deflection for positioning the cluster beam at designated target areas.

An alternate embodiment of the invention allows for an ion optical system capable of focusing and deflecting the cluster beam. By accurately positioning the beam at precise locations on a target substrate, contaminants can be removed from a specified area without irradiating adjacent regions. FIG. 6 shows a three-element electrostatic lens 50 used to focus the cluster beam 34 generated by a single capillary emitter 32. In this arrangement, a focusing voltage is applied to the mid-element lens plate by means of a power supply 52. The polarity of the applied voltage will depend on whether a positive or negative cluster beam is formed. Although FIG. 6 shows a symmetrical, Einzel aperture type lens, other types and geometries of electrostatic lenses can be used to control cluster beams without departing from the scope or spirit of the present invention. These include slit, tubular cylinders and geometrically asymmetric lenses. Electrostatic deflection and rastering to precisely position the cluster beam on the substrate 38 can be provided by a set of orthogonal deflector plates 56, 58 - controlled by applying variable or fixed voltages by means of a rastering power supply 54.

The foregoing description of the preferred embodiment of the invention has been presented for the purposes of illustration and description. However, the foregoing description is not intended to be exhaustive or to limit the invention to the precise form disclosed. Many changes and modifications may be made to the invention by one having ordinary skill in the art, without departing from the spirit or scope of the invention.

What is claimed is:

1. A method for removing contaminants from a surface, the method comprising: a. feeding a liquid to a location where a beam of clusters is generated; b. generating said beam of clusters by exerting, upon said liquid fed to said location, electrostatic forces higher than a surface tension of said liquid; and c. directing said beam of clusters to said surface.

2. The method of claim 1 further including trapping contaminants ejected from said surface when said beam of clusters impacts said surface.

3. The method of claim 2 further including neutralizing said beam of clusters.

4. A method for removing contaminants from a substrate surface the method comprising:

a. providing a conductive fluid to the opening of a source;
   b. forming a beam of charged clusters by applying an electric field to said source to create electrostatic forces higher than a surface tension of said conductive fluid;
   c. neutralizing charge buildup on said substrate surface by ejecting charge into said beam; and
   d. directing said beam to said substrate surface.

5. The method of claim 4 further collecting contaminants ejected when said beam impacts said substrate surface.

6. The method according to claim 4 wherein neutralization includes:

a. providing two linear arrays of plural emitter sources positioned adjacent and parallel to each other; and
   b. forming a beam of positively charged clusters by applying positive voltage to said emitter sources comprising the first array and forming a beam of negatively charged clusters by applying negative voltage to said emitter sources comprising the second array.

* * * * *

UNITED STATES PATENT AND TRADEMARK OFFICE
CERTIFICATE OF CORRECTION

PATENT NO. : 6,033,484
DATED : March 7, 2000
INVENTOR(S) : Mahoney

It is certified that error appears in the above-identified patent and that said Letters Patent is hereby corrected as shown below:

Item [57] Abstract, please delete "A method for cleaning containinated surfaces, especially semiconductor wafers, using energetic cluster beams is diclosed." and insert -- A method and apparatus for cleaning containinated surfaces, especially semiconductor wafers, using energetic cluster beams is diclosed. -- .

Signed and Sealed this

Twenty-second Day of May, 2001

Attest:

NICHOLAS P. GODICI

*Attesting Officer*       *Acting Director of the United States Patent and Trademark Office*